United States Patent
Wu et al.

(10) Patent No.: US 12,142,599 B2
(45) Date of Patent: Nov. 12, 2024

(54) STACKED TRANSISTOR STRUCTURE WITH REFLECTION LAYER

(71) Applicant: INTERNATIONAL BUSINESS MACHINES CORPORATION, Armonk, NY (US)

(72) Inventors: Teresa J. Wu, Rexford, NY (US); Tenko Yamashita, Schenectady, NY (US); Heng Wu, Santa Clara, CA (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 17/655,274

(22) Filed: Mar. 17, 2022

(65) Prior Publication Data

US 2023/0299053 A1   Sep. 21, 2023

(51) Int. Cl.
| | |
|---|---|
| *H01L 23/00* | (2006.01) |
| *H01L 25/00* | (2006.01) |
| *H01L 25/07* | (2006.01) |

(52) U.S. Cl.
CPC ........... *H01L 25/074* (2013.01); *H01L 25/50* (2013.01)

(58) Field of Classification Search
CPC ..... H01L 25/074; H01L 25/50; H01L 21/268; H01L 21/8221
See application file for complete search history.

(56) References Cited

U.S. PATENT DOCUMENTS

| | | | |
|---|---|---|---|
| 8,012,827 B2 | 9/2011 | Yu | |
| 8,557,632 B1 | 10/2013 | Or-Bach | |
| 8,642,416 B2 | 2/2014 | Or-Bach | |
| 8,703,597 B1 | 4/2014 | Sekar | |
| 9,302,348 B2 | 4/2016 | Wang | |
| 9,455,185 B1 | 9/2016 | Gluschenkov | |
| 10,573,533 B2 | 2/2020 | Fuergut | |
| 11,355,475 B2 * | 6/2022 | Yu | H01L 23/3114 |
| 11,626,544 B2 * | 4/2023 | Aoyama | H01L 27/156 257/79 |
| 2021/0098632 A1 | 4/2021 | Duriez | |
| 2023/0299053 A1 * | 9/2023 | Wu | H01L 21/8221 257/777 |

FOREIGN PATENT DOCUMENTS

WO   2011046844 A1   4/2011

OTHER PUBLICATIONS

Wu et. al., "Vertically Integrated Semiconductor Device," U.S. Appl. No. 17/648,817, filed Jan. 25, 2022, 31 pages.

* cited by examiner

*Primary Examiner* — Thao P Le
(74) *Attorney, Agent, or Firm* — Jeffrey M. Ingalls (57) ABSTRACT

A semiconductor device is provided and includes a first substrate including a first transistor; a laser reflection layer on the first transistor; and a second substrate on the laser reflection layer, the second substrate including a second transistor.

18 Claims, 8 Drawing Sheets

STACKED TRANSISTOR STRUCTURE WITH REFLECTION LAYER

BACKGROUND

The present disclosure relates generally to semiconductor devices. More particularly, the present disclosure relates to semiconductor devices formed using compound semiconductor materials.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. In view of the possibility of scaling reaching its limits, other semiconductor materials, such as compound semiconductors have been considered.

SUMMARY

Embodiments of the present disclosure relate to a semiconductor device. The semiconductor device includes a first substrate including a first transistor; a laser reflection layer on the first transistor; and a second substrate on the laser reflection layer, the second substrate including a second transistor.

Other embodiments relate to a method of fabricating a semiconductor device. The method includes forming a first substrate including a first transistor; forming a laser reflection layer on the first transistor; and forming a second substrate on the laser reflection layer, the second substrate including a second transistor.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Exemplary embodiments will now be discussed in further detail with regard to semiconductor devices and methods of manufacturing same and, in particular, to semiconductor devices including stacked transistor logic layers with a reflective layer that is used with nanosecond laser anneal application to the various transistor components. As CMOS scaling begins to hit 2-D plane physical limits, research in the third dimension along a Z-axis direction (a vertical direction) has given rise to stacked transistor concepts to continue scaling. One fundamental challenge with stacking layers of transistors on top of one another has been the known thermal budget impacts to the lower transistor device integrity from subsequent top transistor processes. The thermal impact from top transistor processing on the bottom transistor layer may be of interest.

The use of nanosecond laser anneal together with Rapid Thermal Annealing (RTA) may be used in the production of stacked transistor structures for improving device performance as scaling continues to transition to smaller dimensions. In the present embodiments, by incorporating a laser reflection layer in between two logic device layers in a stacked transistor structure, the technique can enable low temperature device formation solution with nanosecond laser annealing for dopant activation to achieve the top layer transistor performance without adverse thermal effect to the bottom transistor layer(s). This structure and technique of low temperature processing can enable a vertically stacked CMOS device structure to deliver both density and improved performance of the 3D stacked-FET architecture with successive layer building along the Z-axis direction.

It is to be understood that the various layers and/or regions shown in the accompanying drawings are not drawn to scale, and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present embodiments can be employed in applications, hardware, and/or electronic systems. Suitable hardware and systems for implementing embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of the embodiments provided herein, one of ordinary skill in the art will be able to contemplate other implementations and applications of the embodiments.

The present embodiments may be used in connection with semiconductor devices that may require, for example, FinFETs, VTFETs, CMOSs, FETs, nanowire FETs, nanosheet FETs, SETs, and/or MOSFETs. By way of non-limiting example, the semiconductor devices can include, but are not necessarily limited to FinFET, VTFET, CMOS, FET, nanowire FET, nanosheet FET, SET, CMOS and MOSFET devices, and/or semiconductor devices that use FinFET, VTFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

In some embodiments, the method and structures disclosed herein can incorporate multiple semiconductor devices of different materials on the same substrate. In some electrical device applications, there is a need to incorporate multiple semiconductor materials into the same chip. For example, it can be desirable to incorporate semiconductor devices composed of type IV semiconductors, such as silicon containing semiconductors, with semiconductor devices composed of a compound semiconductor materials, such as III-V compound semiconductor materials, on the same chip. Type IV semiconductors, such as silicon containing semiconductor materials, and compound semiconductors, such as III-V compound semiconductor materials, may have different thermal requirements. For example, the activation temperature of the source and drain regions of a semiconductor device composed of a type IV semiconductor material, such as a silicon containing semiconductor material, is typically greater than 1000° C., whereas the activation temperature of the source and drain regions of a semiconductor device composed of a compound semiconductor, such as a III-V compound semiconductor material, typically cannot withstand temperatures greater than 600° C. In some examples, at temperatures greater than 600° C., a compound semiconductor, such as a III-V compound semiconductor material may degrade on a crystalline level. For example, compound semiconductors tend to disassociate at these high temperatures.

In some embodiments, the methods and structures disclosed herein provide a laser annealing step with a far infrared wavelength, e.g., 10 μm to 1 mm, to activate the source and drain regions of a semiconductor device formed of a type IV semiconductor material, such as a silicon containing material. The laser annealing step is selective to the doped regions of the type IV semiconductor material. In this manner, a semiconductor device composed of a compound semiconductor, e.g., type III-V compound semiconductor, may not be impacted by the annealing step that is employed to activate the source and drain regions of a semiconductor device composed of a type IV semiconductor material, in which the semiconductor device composed of the type IV semiconductor material and the semiconductor device composed of the compound semiconductor material are present on the same substrate.

As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. By "same substrate" it is meant that a first semiconductor device comprised of a first semiconductor material, e.g., type IV semiconductor, and a second semiconductor device comprised of a second semiconductor material, e.g., compound semiconductor, are present simultaneously on the same substrate in different regions of the same substrate.

Figure 1:
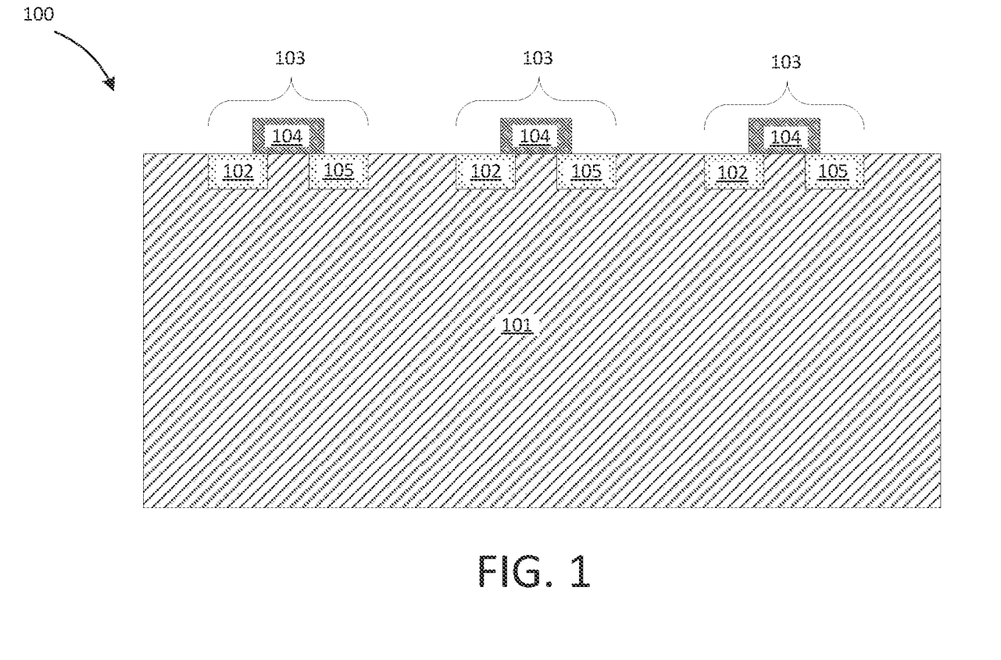
FIG. 1 is a cross-sectional view of a semiconductor device at an intermediate stage of the manufacturing process, according to embodiments.

Referring now to the drawings in which like numerals represent the same or similar elements and initially to FIG. 1, an exemplary method of manufacturing a semiconductor device 100 that includes a stacked transistor structure having multiple transistor layers alternating with reflective layers is shown. As shown in FIG. 1, a substrate 101 is provided. The substrate 101 may include a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

As shown in FIG. 1 a method of fabricating a plurality of first level semiconductor devices 103 on the substrate 101, wherein the first level semiconductor devices 103 have a planar orientation. The term "planar" as used to describe a semiconductor device orientation denotes that the direction of charge carriers from the source region 102 to the drain region 105 of the first level semiconductor device 103 is along a plane that is parallel to the upper surface of the substrate 101, wherein a gate structure 104 is present on the upper surface of the substrate. In one embodiment, the planar semiconductor device is a field effect transistor. As used herein a "field effect transistor" is a transistor in which output current, i.e., source-drain current, is controlled by the voltage applied to the gate structure 104. As used herein, the term "source" is a doped region in the first level semiconductor device 103, in which majority carriers are flowing into the channel. As used herein, the term "drain" means a doped region in first level semiconductor device 103 located at the end of the channel, in which carriers are flowing out of the transistor through the drain.

In some embodiments, the different regions of the substrate 101 corresponding to the locations of the first level semiconductor devices 103 may be separated from one another by an isolation region (not shown) that is positioned between the different regions of the substrate 101. In some embodiments, the isolation region may be a shallow trench isolation (STI) region. The STI region may be formed by etching a trench in the substrate 101 utilizing a dry etching process, such as reactive-ion etching (RIE) or plasma etching. The trenches may optionally be lined with a liner material, e.g., an oxide, and then chemical vapor deposition (CVD) or another like deposition process is used to fill the trench with oxide, nitride, polysilicon or another like STI dielectric material. The STI dielectric may optionally be densified after deposition. A planarization process, such as chemical-mechanical polishing (CMP), may be used to provide a planar structure.

As shown in FIG. 1, a gate structure 104 is formed for each of the first level semiconductor devices 103. The gate structures 104 may be formed using deposition, photolithography and etch processes. More specifically, and in some embodiments, at least one gate dielectric layer (not shown for the sake of simplicity) may be deposited on the upper surface of the substrate 101. The at least one gate dielectric layer that is formed may be composed of any dielectric material including oxides, nitrides and oxynitrides. In one embodiment, the at least one gate dielectric layer may be provided by a high-κ dielectric material, (i.e., a dielectric material having a dielectric constant greater than silicon oxide). In one embodiment, the at least one gate dielectric layer is composed of a high-κ oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-κ dielectric materials for the at least one gate dielectric layer include hafnium silicate, hafnium silicon oxynitride or combinations thereof. In one embodiment, the at least one gate dielectric layer may be deposited by chemical vapor deposition (CVD). Variations of CVD processes suitable for depositing the at least one gate dielectric layer include, but are not limited to, APCVD, LPCVD, PECVD, MOCVD, ALD and combinations thereof. In one embodiment, the thickness of the at least one gate dielectric layer is greater than 0.8 nm. More typically, the at least one gate dielectric layer has a thickness ranging from about 1.0 nm to about 6.0 nm.

In some embodiments, following the formation of the at least one gate dielectric layer (not shown) on the substrate 101, at least one gate conductor layer (not shown) may be formed on the at least one gate dielectric layer to provide the gate structure 104. The at least one gate conductor layer may be formed by a deposition process, such as CVD, plasma-assisted CVD, plating, and/or sputtering, followed by planarization. In one embodiment, the at least one gate conductor layer is composed of an undoped semiconductor. One example of an undoped semiconductor that is suitable for the at least one gate conductor layer is undoped polysilicon.

The gate structure 104 may then be patterned and etched to provide the structures shown in FIG. 1. Specifically, and in one example, a pattern is produced by applying a photoresist over the surfaces to be etched, i.e., at least one gate conductor layer and at least one gate dielectric layer, exposing the photoresist to a pattern of radiation, and then developing the pattern into the photoresist utilizing a resist developer. Once the patterning of the photoresist is completed, the sections of the gate structure 104 covered by the photoresist are protected to provide the gate structures 104, while the exposed regions are removed using a selective etching process that removes the unprotected regions. Following etching, the remaining portions of the at least one dielectric layer provide the gate dielectric. Following formation of the first and second gate structures 104, the photoresist may be removed. In some embodiments, the gate structures 104 can be formed by a replacement gate process.

FIG. 1 depicts one embodiment of forming source regions 102 and drain regions 105 in the various regions of the substrate 101. In one example, the source region 102 and the drain region 105 may be doped with a p-type or n-type dopant. The term "p-type" refers to the addition of impurities to an intrinsic semiconductor that creates deficiencies of valence electrons. In a silicon-containing substrate, examples of p-type dopants (i.e., impurities) include but are not limited to boron, aluminum, gallium and indium. "N-type" refers to the addition of impurities that contributes free electrons to an intrinsic semiconductor. In a silicon containing substrate examples of n-type dopants (i.e., impurities) include but are not limited to antimony, arsenic and phosphorous.

In one example, the source regions 102 and the drain regions 105 may be formed by ion implanting a p-type dopant into the substrate 101. During the ion implantation steps for forming the source regions 102 and the drain regions 105, the substrate 101 may be protected from being implanted with the dopant that forms the source regions 102 and the drain regions 105 by a block mask (not shown). More specifically, prior to ion implantation of the dopant for the source regions 102 and the drain regions 105, a block mask (not shown) may be formed overlying the substrate 101, in which the block mask leaves regions of the substrate 101 corresponding to the source and drain regions exposed. The block mask may be composed of a photoresist material or may be composed of a hard mask material, such as silicon oxide or silicon nitride, that may be removed selectively to the underlying structure. The exposed portions of the substrate 101 are not protected by the block mask, and are ion implanted to provide the p-type source regions 102 and drain regions 105 while the remainder of the substrate 101 is protected by the block mask. In one embodiment, the dopant concentration in the source and drain regions is less than about $3 \times 10^{17}$ atoms/cm$_3$. In another embodiment, the dopant concentration in the source and drain regions is less than about $1 \times 10^{17}$ atoms/cm$^3$.

In one embodiment, when forming the source regions 102 and the drain regions 105 having a p-type conductivity, a typical dopant species is boron or $BF_2$. Boron may be implanted utilizing implant energies ranging from 0.2 keV to 3.0 keV with an implant dose ranging from $5 \times 10^{14}$ atoms/cm$^2$ to $5 \times 10^{15}$ atoms/cm$^2$. $BF_2$ may be implanted utilizing implant energies ranging from 1.0 keV to 15.0 keV and a dose ranging from $5 \times 10^{14}$ atoms/cm$^2$ to $5 \times 10^{15}$ atoms/cm$^2$. The concentration of the p-type dopant in the source regions 102 and drain regions 105 may range from $1 \times 10^{18}$ atoms/cm$^3$ to $8 \times 10^{21}$ atoms/cmv$^3$. In another embodiment, the dopant concentration of the p-type dopant in the source regions 102 and the drain regions 105 ranges from $1 \times 10^{19}$ atoms/cm$^3$ to $3 \times 10^{20}$ atoms/cm$^3$. Following formation of the source regions 102 and the drain regions 105, the block mask that is present over the substrate 101 is removed.

After forming the source regions 102 and the drain regions 105, laser annealing may be performed on the substrate 101 to activate, i.e., dopant activate, the source regions 102 and the drain regions 105. "Dopant activation" or "dopant activation" is the process of obtaining an electronic contribution from an impurity species, i.e., dopant, such as p-type or n-type dopant, in a semiconductor host. For example, after ion implantation into the source and drain regions of the semiconductor device, the doping atoms, i.e., p-type or n-type dopants, such as boron (B), arsenic (As) and phosphorus (P), are in interstitial sites of the crystal lattice of the substrate, i.e., silicon (Si) lattice. In some embodiments, upon annealing, such as thermal annealing or laser annealing, the dopant atoms, i.e., n-type or p-type atoms, move to a substitutional position within the lattice and become electrically active, i.e., they provide an electrical contribution to the semiconductor material. As used herein, the term "laser annealing" denotes an annealing method that employs a laser to induce heat in the surface being treated. A laser is an electronic-optical device that emits coherent radiation. In some embodiments, a typical laser emits light in a narrow, low-divergence beam and with a defined wavelength (corresponding to a particular color if the laser operates in the visible spectrum). In some embodiments, the laser type that is employed in the laser annealing method is an excimer laser. Excimer lasers can be powered by a chemical reaction involving an excited dimer, or excimer, which is a short-lived dimeric or heterodimeric molecule formed from two species (atoms), at least one of which is in an excited electronic state. Commonly used excimer molecules include $F_2$ (fluorine, emitting at 157 nm), and noble gas compounds (ArF (193 nm), KrCl (222 nm), KrF (248 nm), XeCl (308 nm), and XeF (351 nm)).

The laser annealing is selective to only the doped regions, source regions 102 and drain regions 105, of the semiconductor substrate 101. More specifically, and in some examples, the laser annealing only induces increased thermal heating in the source regions 102 and the drain regions 105. In one embodiment, the laser annealing of the source regions 102 and the drain regions 105 increases the temperature of these doped regions to a temperature greater than 1000° C. In some embodiments, the laser annealing of the source regions 102 and the drain regions 105 increases the temperature of these doped regions to a temperature ranging from 800° C. to 1300° C. In another embodiment, the laser annealing of the source regions 102 and the drain regions 105 increases the temperature of these doped regions to a temperature ranging from 1000° C. to 1200° C.

In one example, activating the source regions 102 and the drain regions 105 includes a laser annealing process having a wavelength ranging from 10 μm to 1 mm. In another embodiment, activating the source regions 102 and the drain regions 105 includes a laser annealing process having a wavelength ranging from 15 μm to 500 mm. In yet another embodiment, activating the source regions 102 and the drain regions 105 includes a laser annealing process having a wavelength ranging from 30 μm to 300 mm. In some embodiments, the energy density of the laser beam at the irradiated surface, i.e., surface to be annealed, falls in a range of 100 mJ/cm$^2$ through 500 mJ/cm$^2$. In another embodiment, the energy density of the laser beam at the irradiated surface falls in a range of 200 mJ/cm$^2$ through 400 mJ/cm$^2$. For example, the energy density of the laser beam at the irradiated surface may be 260 mJ/cm$^2$. In some embodiments, the oscillation frequency of the laser is set to 30 Hz and in respect of one point of an irradiated object, 10 through 50 shots of laser beam is irradiated. In some embodiments, in which the laser used in the laser annealing process is an excimer laser, the pulse width of the pulse excimer laser beam is in the range of 20 to 40 nanoseconds (nsec) and the maximum frequency of the pulse excimer laser beam is, e.g., 300 pulses/sec. Thus, the source regions 102 and the drain regions 105 may be formed using ion implantation and may be doped to an n-type or a p-type conductivity. After the annealing process, the devices can follow normal semiconductor processing such as silicide and metal via connection formation (not shown for the sake of simplicity).

FIG. 1 depicts one embodiment of a method of forming planar semiconductor devices. It is noted that the above method is not limited to only semiconductor devices. For example, the above described method of activating the source and drain regions of a semiconductor device is equally applicable to fin field effect transistors (finFETs). As used herein, the term "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

Figure 2:
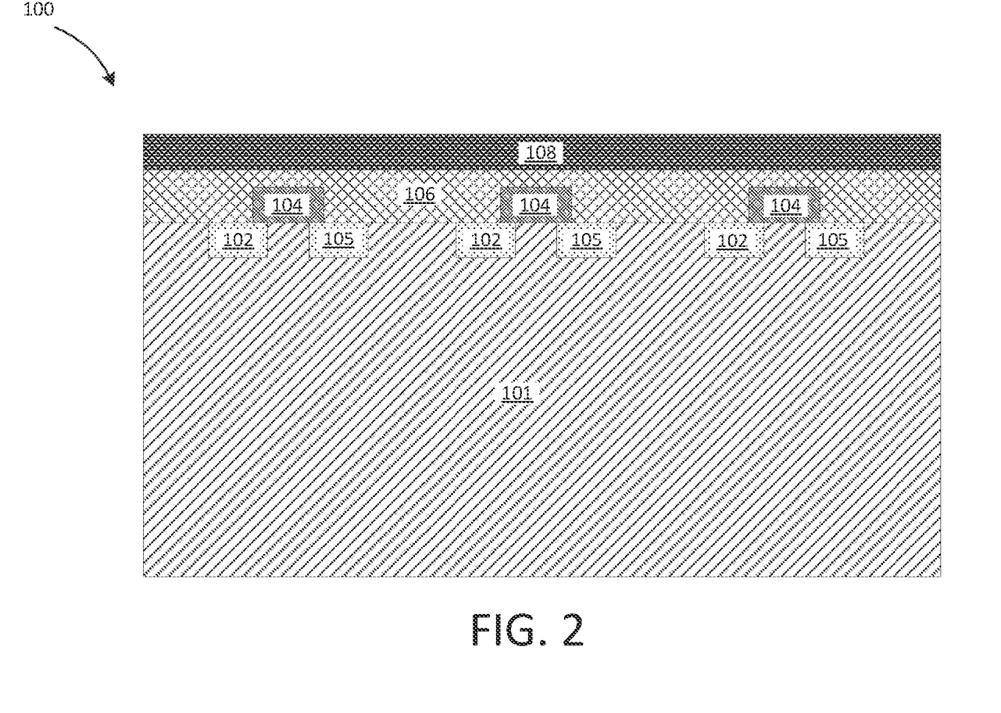
FIG. 2 is a cross-sectional view of the semiconductor device of FIG. 1 after additional fabrication operations, according to embodiments.

Referring now to FIG. 2, this figure is a cross-sectional view of the semiconductor device of FIG. 1 after additional fabrication operations, according to embodiments. As shown in FIG. 2, a dielectric layer 106 is formed to cover the substrate 101 and the gate structures 104. The dielectric layer 106 that is formed may be composed of any dielectric material including oxides, nitrides and oxynitrides. In one embodiment, the dielectric layer 106 is composed of an interlayer dielectric (ILD) material such as $SiO_2$. In one embodiment, the dielectric layer 106 may be deposited by chemical vapor deposition (CVD). Variations of CVD processes suitable for depositing the dielectric layer 106 include, but are not limited to, APCVD, LPCVD, PECVD, MOCVD, ALD and combinations thereof.

As shown in FIG. 2, after the deposition of the dielectric layer 106, a laser reflection layer 108 is deposited thereon. By incorporating a laser reflection layer 108 in between two logic device layers (i.e., the first level semiconductor device 103 identified in FIG. 1 and the second layer semiconductor device 119 discussed below with reference to FIG. 5) in a stacked transistor structure, the present embodiments enable a low temperature device formation solution with nanosecond laser annealing for dopant activation to achieve the top layer transistor performance without adverse thermal effects to the bottom device (e.g., the first level semiconductor device 103) fidelity. This structure and technique of low temperature processing can enable a vertically stacked CMOS device structures to deliver both density and performance promise for the 3D stacked-FET architecture with successive layer building along the Z-axis direction. In the present embodiments, the introduction of the extra laser annealing reflection layer in between the logic layers provides for concentrated thermals for the upper logic layers with no impact for the bottom layer logics. This may allow for improvements in the process windows for stacked FET devices. It should be appreciated that the laser reflection layer 108 may have any suitable material composition (e.g., TiN, etc.) provided that it reflects at least a substantial portion of the laser light back up and away from the first level semiconductor devices 103 (see FIG. 1) during a subsequent nanosecond laser annealing process on the second layer semiconductor devices 119 (see FIG. 5).

Figure 3:
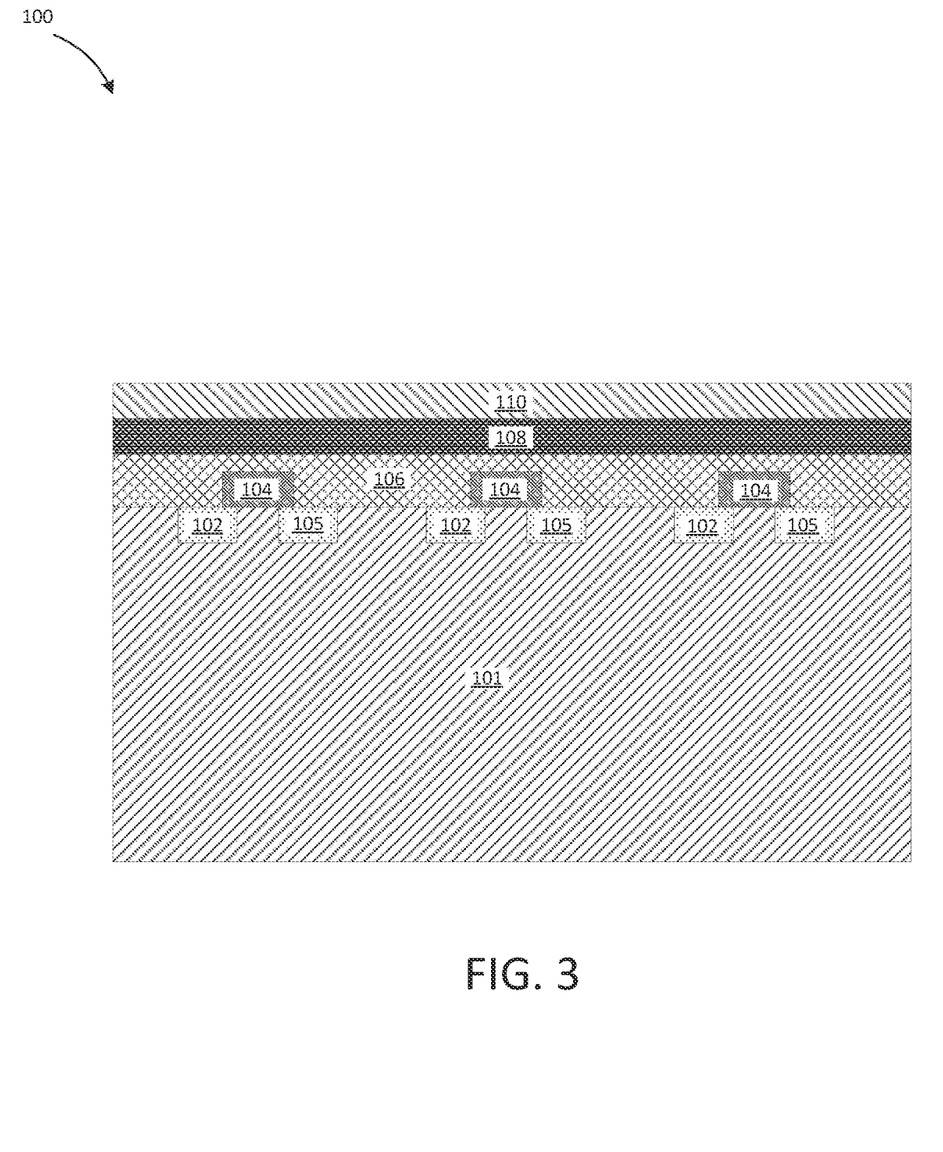
FIG. 3 is a cross-sectional view of the semiconductor device of FIG. 2 after additional fabrication operations, according to embodiments.

Referring now to FIG. 3, this figure is a cross-sectional view of the semiconductor device of FIG. 2 after additional fabrication operations, according to embodiments. As shown in FIG. 3, after the formation of the laser reflection layer 108, a second dielectric layer 110 is formed on the laser reflection layer 108. In one embodiment, the second dielectric layer 110 is composed of $SiO_2$, SiN or $AlO_x$, for example. In one embodiment, the dielectric layer 110 may be deposited by chemical vapor deposition (CVD). Variations of CVD processes suitable for depositing the dielectric layer 110 include, but are not limited to, APCVD, LPCVD, PECVD, MOCVD, ALD and combinations thereof. The material composition of the second dielectric layer 110 may be the same or different as that of the dielectric layer 106.

Figure 4:
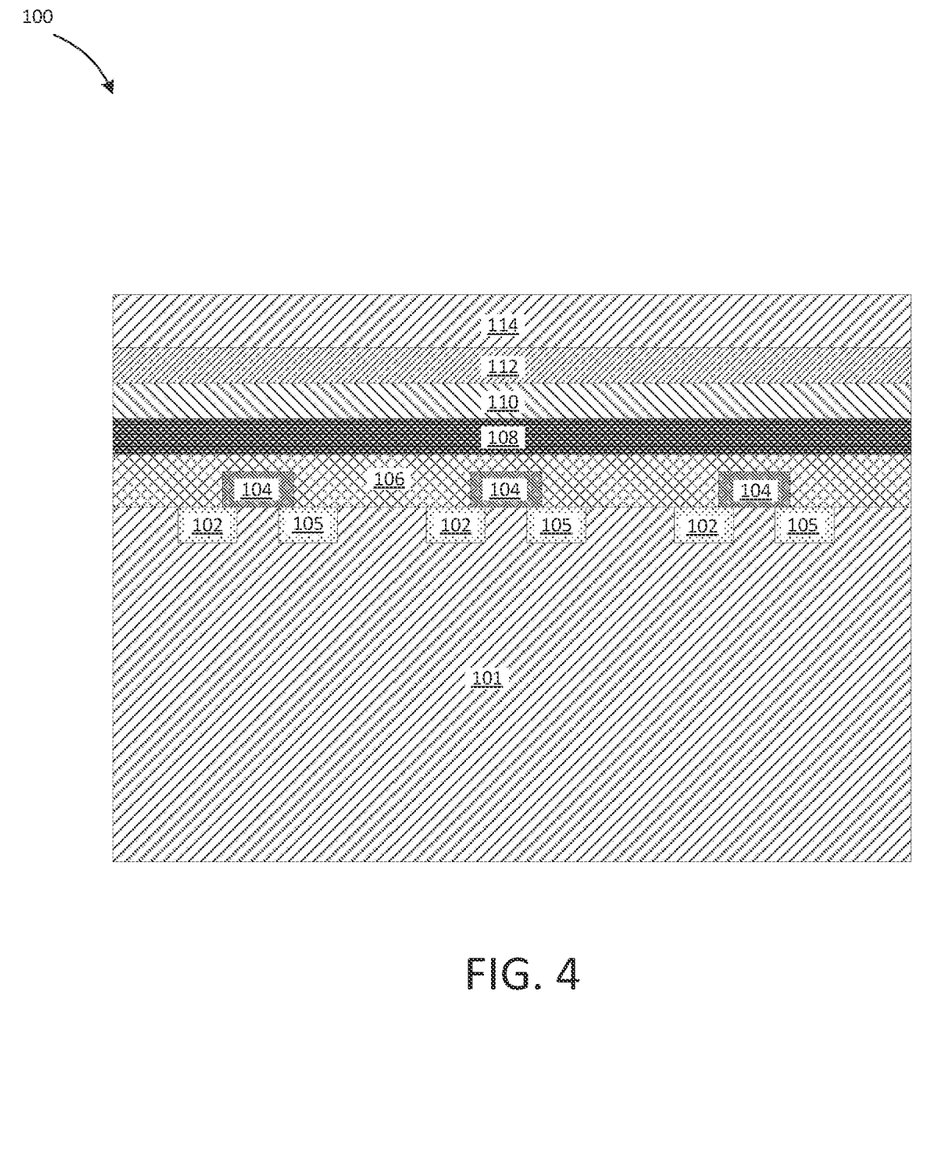
FIG. 4 is a cross-sectional view of the semiconductor device of FIG. 3 after additional fabrication operations, according to embodiments.

Referring now to FIG. 4, this figure is a cross-sectional view of the semiconductor device of FIG. 3 after additional fabrication operations, according to embodiments. As shown in FIG. 4, after the formation of the second dielectric layer 110, a thin bonding layer 112 is formed. The bonding layer 112 may include a bonding oxide material, for example. Then, the semiconductor device 100 is bonded to a second silicon substrate 114. In certain embodiments, after the bonding process is completed, the second silicon substrate 114 may be thinned with a CMP process, for example.

Figure 5:
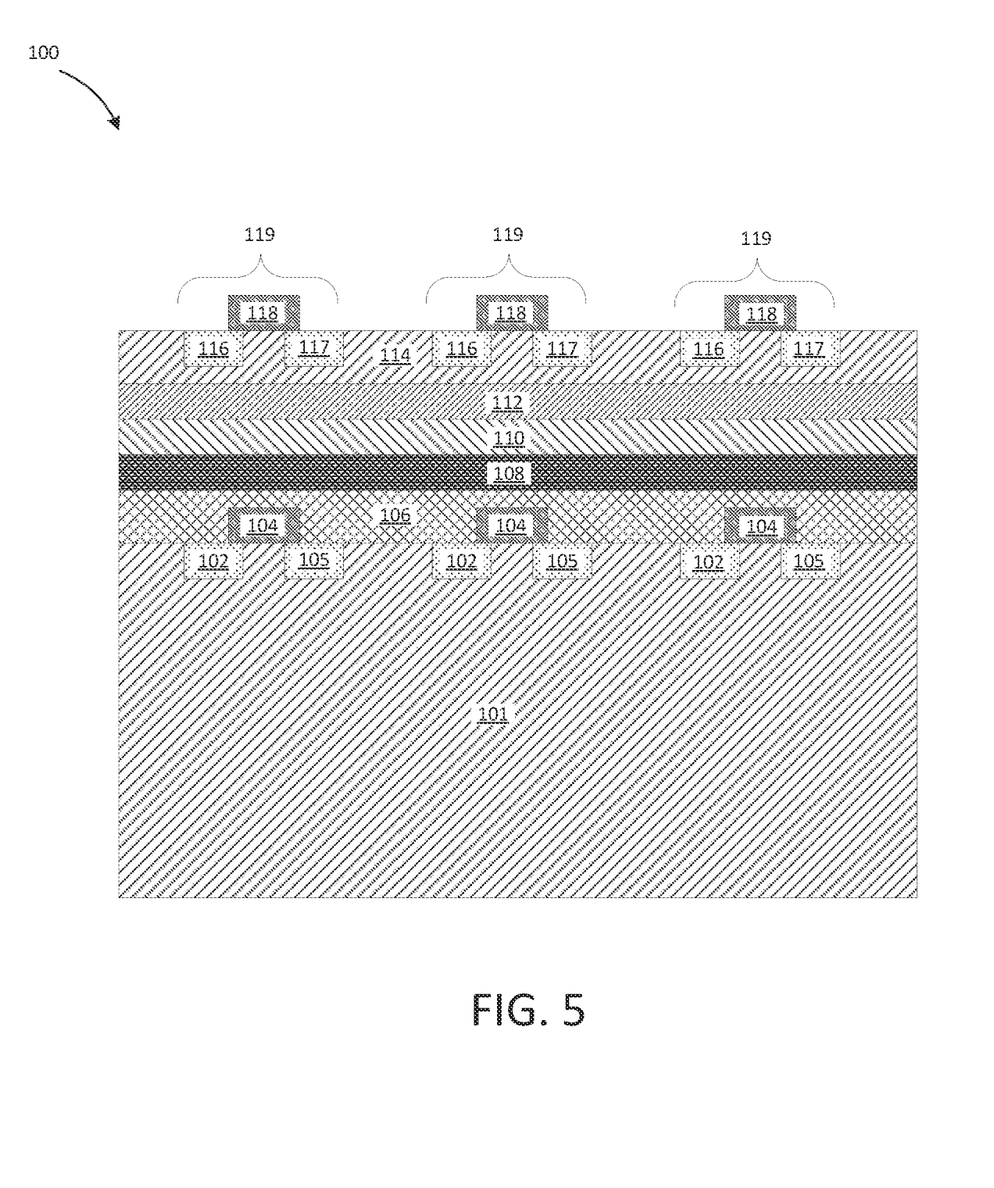
FIG. 5 is a cross-sectional view of the semiconductor device of FIG. 4 after additional fabrication operations, according to embodiments.

Referring now to FIG. 5, this figure is a cross-sectional view of the semiconductor device of FIG. 4 after additional fabrication operations, according to embodiments. As shown in FIG. 5, the second substrate 114 may include a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The second substrate 114 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

As shown in FIG. 5 a method of fabricating a plurality of second layer semiconductor devices 119 on the second substrate 114, wherein the second layer semiconductor devices 119 have a planar orientation. In some embodiments, the different regions of the second substrate 114 corresponding to the locations of the second layer semiconductor devices 119 may be separated from one another by an isolation region (not shown) that is positioned between the different regions of the second substrate 114. In some embodiments, the isolation region may be a shallow trench isolation (STI) region. A planarization process, such as chemical-mechanical polishing (CMP), may be used to provide a planar structure.

As shown in FIG. 5, and similar to the process described above with respect to FIG. 1, a second level gate structure 118 is formed for each of the second level semiconductor devices 119. The second level gate structures 118, the second level source regions 116 and the second level drain regions 117 may be formed using similar materials and processes to those described above with respect to the first level semiconductor devices 103 and description is omitted here for the sake of brevity. However, it should be appreciated that the type of semiconductor device for the second level semiconductor devices 119 may be the same or different than that for first level semiconductor devices 103.

Figure 6:
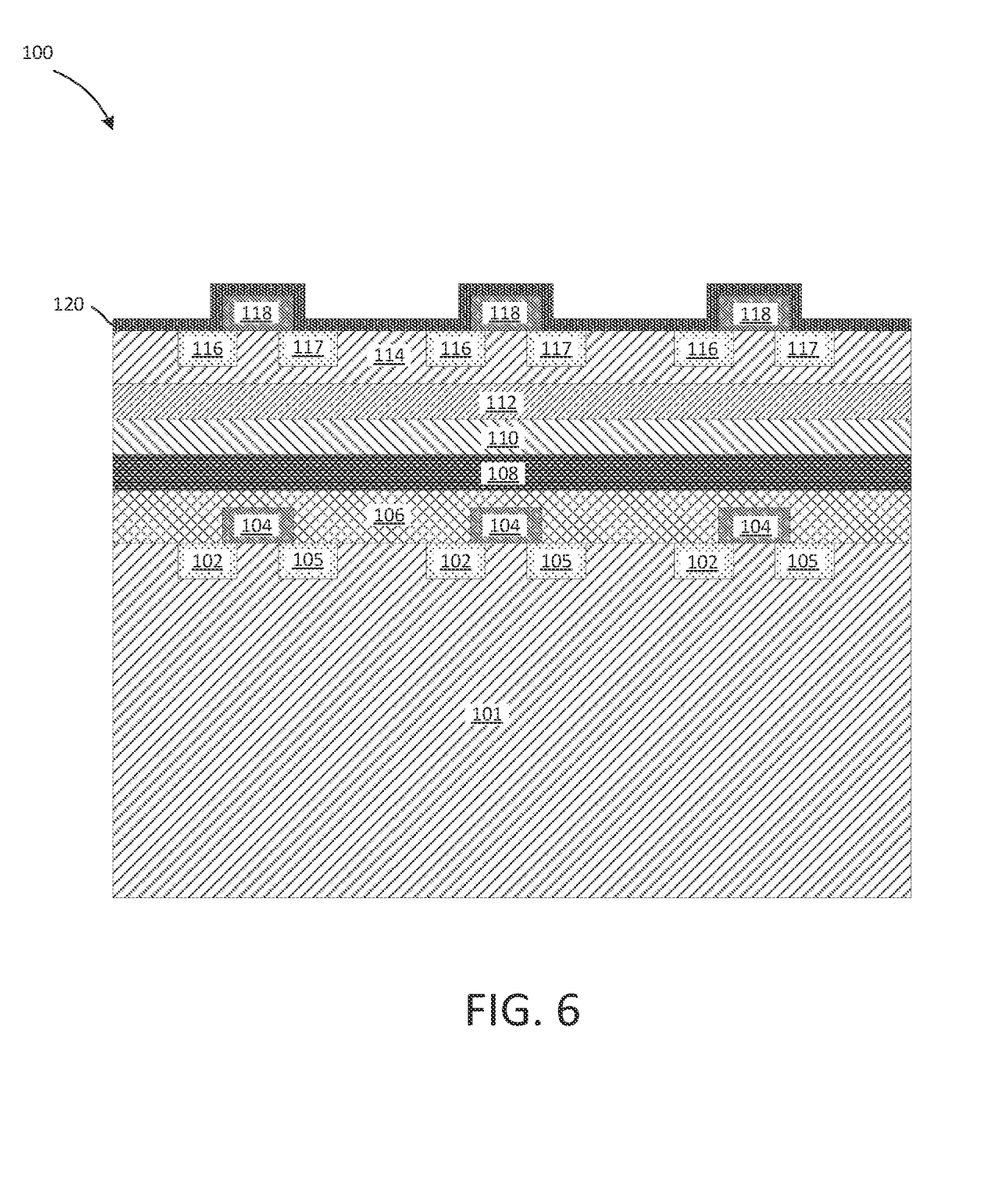
FIG. 6 is a cross-sectional view of the semiconductor device of FIG. 5 after additional fabrication operations, according to embodiments.

Referring now to FIG. 6, this figure is a cross-sectional view of the semiconductor device of FIG. 5 after additional fabrication operations, according to embodiments. As shown in FIG. 6, an absorber layer 120 is conformally deposited over the second level semiconductor devices 119. The absorber layer 120 may be opaque or partially transparent, and may improve laser energy interaction with the device surface.

Figure 7:
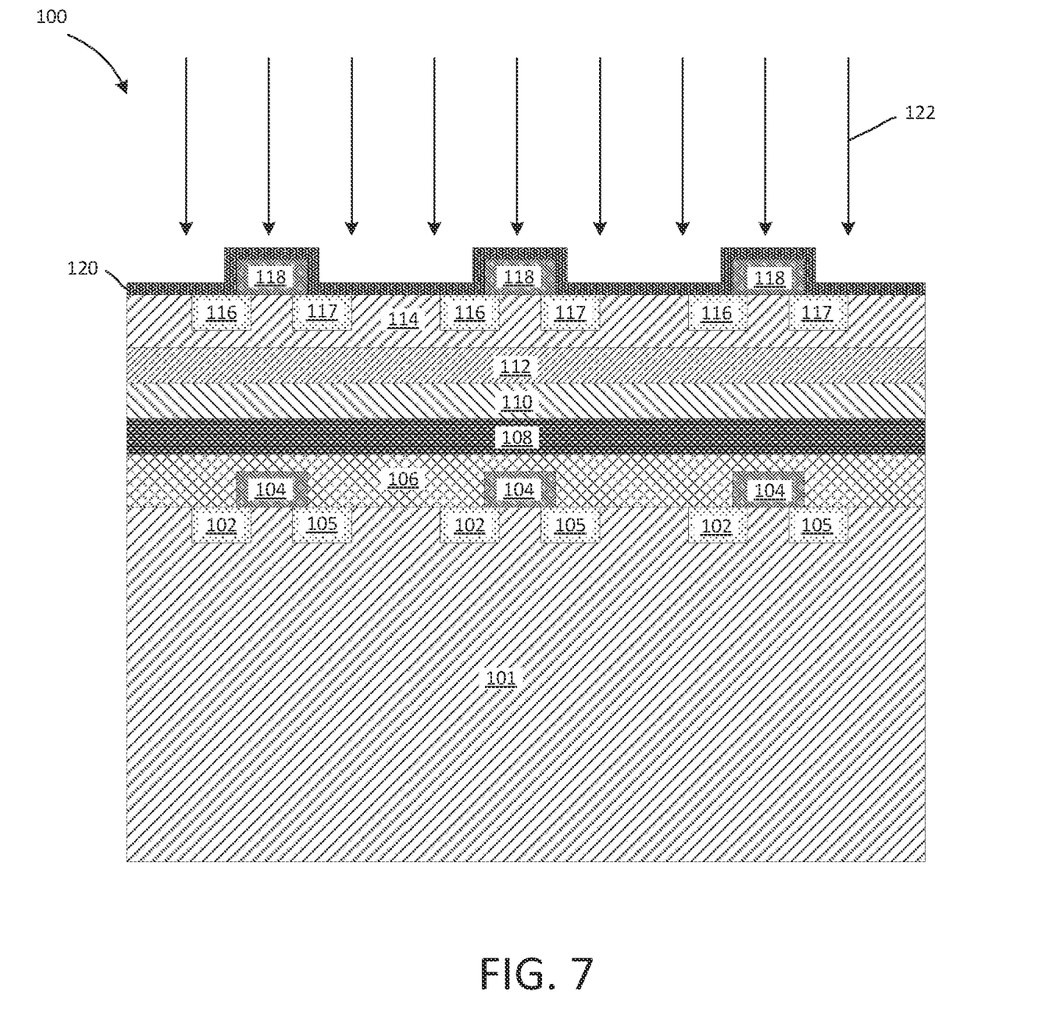
FIG. 7 is a cross-sectional view of the semiconductor device of FIG. 6 after additional fabrication operations, according to embodiments.

Referring now to FIG. 7, this figure is a cross-sectional view of the semiconductor device of FIG. 6 after additional fabrication operations, according to embodiments. As shown in FIG. 7, after forming the second level source regions 116 and the second level drain regions 117, laser annealing 122 is once again performed on the second substrate 114 to activate, i.e., dopant activate, the second level source regions 116 and the second level drain regions 117. Thus, the second level source regions 116 and the second level drain regions 117 may be formed using ion implantation and may be doped to an n-type or a p-type conductivity. After the annealing process, the devices can follow normal semiconductor processing such as silicide and metal via connection formation (not shown for the sake of simplicity). Due to the presence of the laser reflection layer 108, the second level semiconductor devices 119 can be activated without damaging the first level semiconductor devices 103 below.

Figure 8:
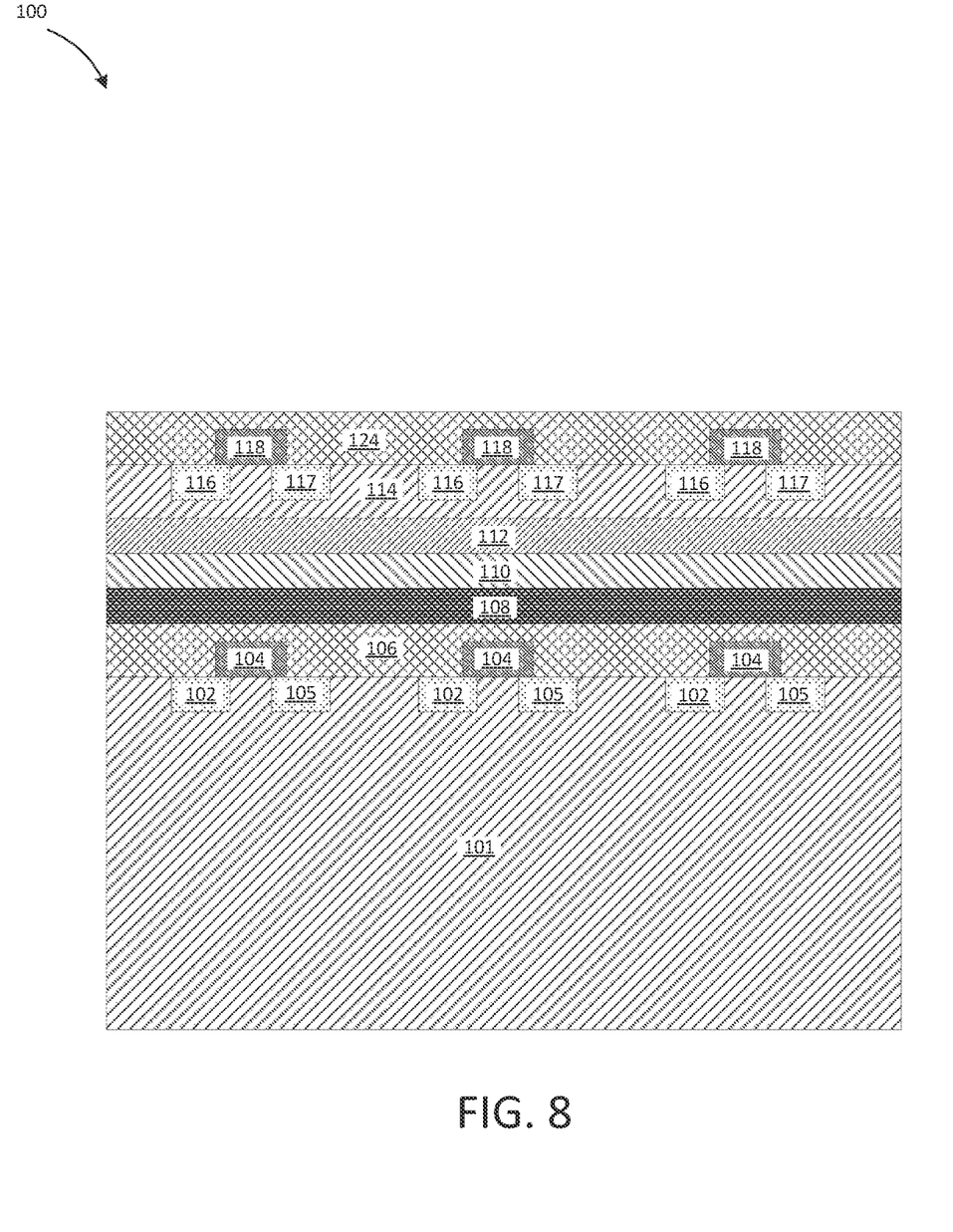
FIG. 8 is a cross-sectional view of the semiconductor device of FIG. 7 after additional fabrication operations, according to embodiments.

Referring now to FIG. 8, this figure is a cross-sectional view of the semiconductor device of FIG. 7 after additional fabrication operations, according to embodiments. As shown in FIG. 8, after the laser annealing process is complete, the absorber layer 120 is removed and a third dielectric layer 124 is deposited. In one embodiment, the third dielectric layer 124 is composed of an interlayer dielectric (ILD) material such as $SiO_2$. In one embodiment, the third dielectric layer 124 may be deposited by chemical vapor deposition (CVD). Variations of CVD processes suitable for depositing the third dielectric layer 124 include, but are not limited to, APCVD, LPCVD, PECVD, MOCVD, ALD and combinations thereof. The material composition of the third dielectric layer 124 may be the same or different as that of the dielectric layer 106 and/or the second dielectric layer 110.

Figure 9:
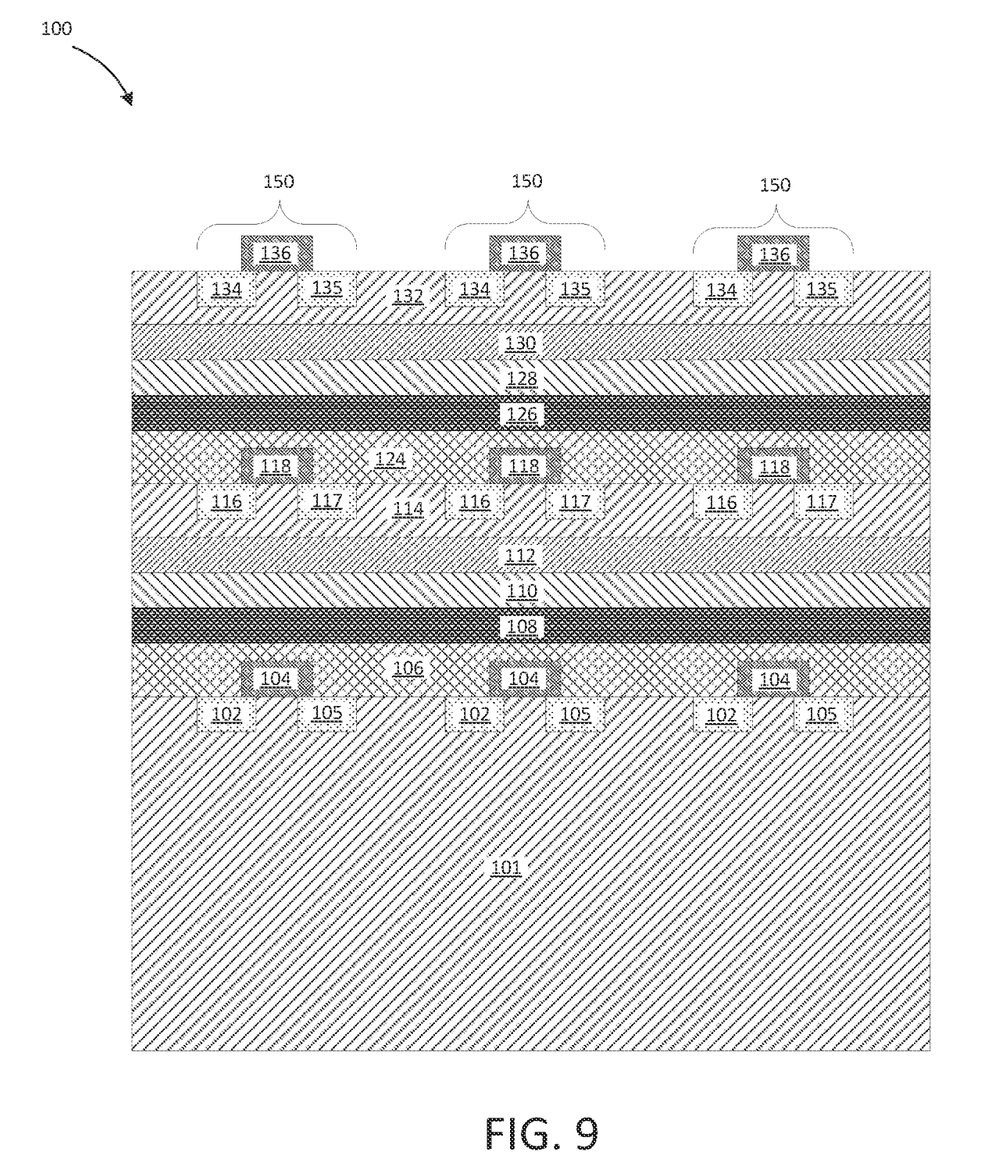
FIG. 9 is a cross-sectional view of the semiconductor device of FIG. 8 after additional fabrication operations, according to embodiments.

Referring now to FIG. 9, this figure is a cross-sectional view of the semiconductor device of FIG. 8 after additional fabrication operations, according to embodiments. As shown in FIG. 9, after the deposition of the third dielectric layer 124, a second laser reflection layer 126 is deposited thereon. By incorporating a second laser reflection layer 126 in between two logic device layers (i.e., the second layer semiconductor devices 119 identified in FIG. 5 and the third layer semiconductor devices 150 shown in FIG. 9) in a stacked transistor structure, the present embodiments enable a low temperature device formation solution with nanosecond laser annealing for dopant activation to achieve the top layer transistor performance without adverse thermal effects to the bottom device (e.g., either the first level semiconductor device 103 or the second layer semiconductor device 119) fidelity. This structure and technique of low temperature processing can enable a vertically stacked CMOS device structures to deliver both density and performance promise for the 3D stacked-FET architecture with successive layer building along the Z-axis direction. In the present embodiments, the introduction of the extra laser annealing reflection layer in between the logic layers provides for concentrated thermals for the upper logic layers with no impact for the bottom layer logics. This may allow for improvements in the process windows for stacked FET devices. It should be appreciated that the second laser reflection layer 126 may have any suitable material composition provided that it reflects at least a substantial portion of the laser light back up and away from the first level semiconductor devices 103 and the second layer semiconductor devices 119) during a subsequent nanosecond laser annealing process on the third layer semiconductor devices 150.

As shown in FIG. 9, after the formation of the second laser reflection layer 126, a fourth dielectric layer 128 is formed. The material of the fourth dielectric layer 128 may be the same or different than the other dielectric layers described above. After the formation of the fourth dielectric layer 128, a second bonding layer 130 is formed. The second bonding layer 130 may include a bonding oxide material, for example. Then, the third semiconductor devices 150 are bonded to the remainder of the semiconductor device 100. In certain embodiments, after the bonding process is completed, the third silicon substrate 132 may be thinned with a CMP process, for example. As shown in FIG. 9, and similar to the process described above with respect to FIGS. 1-5, a third level gate structure 136 is formed for each of the third level semiconductor devices 150. The third level gate structures 136, the third level source regions 134 and the third level drain regions 135 may be formed using similar materials and processes to those described above with respect to the first level semiconductor devices 103 and the second level semiconductor devices 119 and description is omitted here for the sake of brevity. However, it should be appreciated that the type of semiconductor device for the third level semiconductor devices 150 may be the same or different than that for first level semiconductor devices 103 and/or the second level semiconductor devices 119. It should be appreciated that the processes described above may be repeated to include more than three levels of semiconductor devices, with a laser reflection layer between each successive layer. That is, the use of the reflection layer enables successive FET layer stacking without any impact to lower device layers' thermal integrity by repeating the device layer formation sequence as described above.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    a first substrate including a first transistor;
    a laser reflection layer on the first transistor; and
    a second substrate on the laser reflection layer, the second substrate including a second transistor,
    wherein the laser reflection layer configured to allow laser annealing of the second transistor without allowing damage to occur to the first transistor.

2. The semiconductor device of claim 1, wherein the laser reflection layer includes TiN.

3. The semiconductor device of claim 1, further comprising:
    a second laser reflection layer on the second transistor; and
    a third substrate on the second laser reflection layer, the third substrate including a third transistor.

4. The semiconductor device of claim 1, wherein the first substrate is bonded to the second substrate with a bonding layer.

5. The semiconductor device of claim 1, further comprising:
    a first dielectric layer formed between the laser reflection layer and the first substrate; and
    a second dielectric layer formed between the laser reflection layer and the second substrate.

6. The semiconductor device of claim 1, wherein the first and second transistors are devices selected from the group consisting of FinFET, VTFET, CMOS, field-effect transistor (FET), nanowire FET, nanosheet FETs, metal-oxide-semiconductor field-effect transistor (MOSFET), and single electron transistor (SET).

7. The semiconductor device of claim 1, wherein the first and second transistors each include a source region, a drain region, and a gate structure.

8. The semiconductor device of claim 5, wherein the first and second dielectric layers each include $SiO_2$.

9. The semiconductor device of claim 1, wherein the first transistor and the second transistor form a stacked structure that is separated by the laser reflection layer.

10. A method of fabricating a semiconductor device, the method comprising:
    forming a first substrate including a first transistor;
    forming a laser reflection layer on the first transistor; and
    forming a second substrate on the laser reflection layer, the second substrate including a second transistor,
    wherein the laser reflection layer configured to allow laser annealing of the second transistor without allowing damage to occur to the first transistor.

11. The method of fabricating a semiconductor device of claim 10, wherein the laser reflection layer includes TiN.

12. The method of fabricating a semiconductor device of claim 10, further comprising:
    forming a second laser reflection layer on the second transistor; and
    forming a third substrate on the second laser reflection layer, the third substrate including a third transistor.

13. The method of fabricating a semiconductor device of claim 10,
    further comprising bonding the first substrate to the second substrate with a bonding layer.

14. The method of fabricating a semiconductor device of claim 10, further comprising:
    forming a first dielectric layer between the laser reflection layer and the first substrate; and
    forming a second dielectric layer between the laser reflection layer and the second substrate.

15. The method of fabricating a semiconductor device of claim 10, wherein the first and second transistors are devices selected from the group consisting of FinFET, VTFET, CMOS, field-effect transistor (FET), nanowire FET, nanosheet FETs, metal-oxide-semiconductor field-effect transistor (MOSFET), and single electron transistor (SET).

16. The method of fabricating a semiconductor device of claim 10, wherein the first and second transistors each include a source region, a drain region, and a gate structure.

17. The method of fabricating a semiconductor device of claim 14, wherein the first and second dielectric layers each include $SiO_2$.

18. The method of fabricating a semiconductor device of claim 10, wherein the first transistor and the second transistor form a stacked structure that is separated by the laser reflection layer.

* * * * *